United States Patent
Rutiser

(10) Patent No.: US 6,740,543 B2
(45) Date of Patent: May 25, 2004

(54) METHOD AND APPARATUS FOR ENCAPSULATING ARTICLES BY STENCIL PRINTING

(75) Inventor: Claire Rutiser, Willow Grove, PA (US)

(73) Assignee: Kulicke & Soffa Industries, Inc., Willow Grove, PA (US)

( * ) Notice: Subject to any disclaimer, the term of this patent is extended or adjusted under 35 U.S.C. 154(b) by 147 days.

(21) Appl. No.: 10/092,460

(22) Filed: Mar. 7, 2002

(65) Prior Publication Data

US 2003/0170935 A1 Sep. 11, 2003

(51) Int. Cl.[7] .................. H01L 21/48; H05K 13/00; B41M 1/12
(52) U.S. Cl. .................. 438/112; 438/126; 438/127; 29/855; 29/856; 101/129
(58) Field of Search .................. 438/22, 26, 48, 438/106, 110, 111, 112, 125–127; 29/841, 855, 856; 118/209, 213, 232, 233, 244, 256, 258, 301, 323, 404, 406; 101/116, 119, 123, 124, 129, 366; 222/330, 386; 427/96, 272, 282

(56) References Cited

U.S. PATENT DOCUMENTS

| | | | | |
|---|---|---|---|---|
| 4,622,239 A | * | 11/1986 | Schoenthaler et al. | 427/96 |
| 6,158,338 A | * | 12/2000 | MacRaild et al. | 101/123 |
| 6,395,087 B1 | * | 5/2002 | Jairazbhoy et al. | 118/406 |
| 6,495,199 B1 | * | 12/2002 | Kaiser et al. | 427/96 |
| 6,553,905 B2 | * | 4/2003 | Miyahara et al. | 101/129 |
| 6,588,335 B1 | * | 7/2003 | Bourrieres et al. | 101/129 |

FOREIGN PATENT DOCUMENTS

WO    WO 9620088 A1  *  7/1996  ........... B41F/15/42

* cited by examiner

*Primary Examiner*—Alonzo Chambliss
(74) *Attorney, Agent, or Firm*—Synnestvedt & Lechner LLP

(57) ABSTRACT

The present invention is a method and apparatus for encapsulating semiconductor dies and other devices using stencil printing techniques. The apparatus includes a pressurized vessel for containing encapsulation material, the apparatus having a head including a slot through which the encapsulating material escapes into the apertures of the stencil. The head is angularly adjustable relative to the stencil and thus relative to the streets between the semiconductor dies that are in the apertures of the stencil so that the head can be adjusted to the optimal angle for filling both the vertical and horizontal streets between the dies and minimizing the creation of voids in the encapsulant. The method involves encapsulating semiconductor dies using a pressurized stencil printing machine having a slot through which the encapsulating material is forced into the apertures in the stencil and wherein the slot is at a large angle relative to both the vertical and horizontal streets. Preferably, the angle is between 5 and 50 degrees. More preferably, the angle is 45 degrees to both the horizontal and vertical streets. Alternately, the angle is 15 degrees to one of the sets of streets.

18 Claims, 3 Drawing Sheets

METHOD AND APPARATUS FOR ENCAPSULATING ARTICLES BY STENCIL PRINTING

FIELD OF THE INVENTION

The invention pertains to semiconductor packaging and other device packaging. More particularly, the invention pertains to encapsulation of semiconductors and other devices by stencil printing.

BACKGROUND OF THE INVENTION

Stencil printing was originally introduced to the semiconductor field for use in placing formations such as solder bumps on the surfaces of semiconductor dies. Essentially, the semiconductor dies are placed under stencils or screens with apertures corresponding to the spots on the surfaces of the die where, for example, solder bumps are to be placed. The depth or height dimension of the stencil is selected to be equal to the desired height of the solder bumps. A viscous solder paste is then applied over the stencil with a wiper or squeegee oriented at an acute angle to the top surface of the stencil. The squeegee horizontally traverses the stencil and pushes the solder paste ahead of it as well as down into the apertures, thus depositing the solder paste in the desired locations of the solder bumps on the surface of the semiconductor die. The stencil is then removed, leaving solder bumps in the desired spots.

Another major use of stencil printing is printing of die attach adhesives. Attempts have been made to use stencil printing in other applications pertaining to semiconductors. Particularly, stencil printing has been attempted for encapsulating semiconductor dies. A stencil printing process for encapsulation of semiconductor dies might involve placing a plurality of dies on a substrate in a regular rectangular pattern such that there are a plurality of parallel vertical streets and a plurality of parallel horizontal streets defining the spaces between the dies. It should be understood that the terms vertical and horizontal are arbitrary and are not intended to define any particular orientation of the streets to the horizon, but merely that the two sets of streets are more or less orthogonal to each other. The terms horizontal and vertical are used herein because they are the terms generally used by persons of skill in the related arts. A stencil is then rested on the substrate so that the dies appear in the aperture or apertures of the stencil.

The width of the streets is selected to provide the desired thickness of encapsulant around the dies. Thus, for example, the width of the streets generally will be selected to be twice the desired encapsulant thickness plus the kerf of the saw blade that will be used to dice the chips. The spacing between the walls of the apertures and the outermost dies that are adjacent the walls need be only as wide as the desired encapsulant thickness since those streets are not shared between two dies, nor do they necessarily have to be sawn for dicing purposes. The stencil apertures have a height equal to the height of the die plus the desired depth of the encapsulant on the top surface of the dies. The area of the apertures is selected to accommodate the desired number of dies.

Each aperture in the stencil typically will contain a plurality of dies laid out in a rectangular pattern and the stencil may have a plurality of such apertures also laid out in a rectangular pattern. However, each die may correspond to a separate aperture in the stencil, if desirable.

A viscous liquid encapsulating material is applied into the apertures as described above using a squeegee that runs over the stencil and forces the material into the apertures in the stencil, covering all sides of the dies therein, except for the side face down and in contact with the substrate. Depending of the particular process, the dies may be placed face up or face down on the substrate. In either event, the surface that is face down on the substrate does not become covered with the encapsulant. However, all of the other sides do. The substrate itself essentially acts as the protective cover for the face down side of the die.

The stencil is then removed and the substrate and plurality of dies are placed in a curing oven to heat cure and harden the encapsulating material. Alternately, UV energy or other methods may be used to cure the encapsulating material. After curing, the substrate is sawn along the horizontal and vertical streets in order to dice the encapsulated semiconductor chips from each other.

In encapsulation applications, the apertures in the stencils will be much larger than in solder bumping applications The size of the apertures when stencil printing is used for encapsulation of semiconductor dies can range as high several inches across each side. Likely aperture sizes include 0.75"×0.75", 2"×2" and 2"×6". On the other hand, the apertures found in stencil printing for solder bumping typically might range from about 50 microns to 100 microns and be circular in shape.

It has been found that encapsulating semiconductor dies by stencil printing tends to leave substantially more and larger voids in the encapsulant than more traditional encapsulation techniques, such as injection molding. Accordingly, stencil printing for semiconductor encapsulation has never been widely commercially accepted.

Several stencil printing machine manufacturers now offer stencil printing machines for solder bumping in which the solder paste is contained in a pressurized vessel in order to push the paste more forcibly into the apertures in the stencil. One such line of machines is the Horizon series of stencil printing machines manufactured by DEK, Inc. of Surrey, England, which includes, among others, the Horizon 265 model. In such stencil printing machines, the solder paste is contained in a closed vessel that can be pressurized to dispense the solder paste. At the bottom of the vessel is a printing head that includes a long, narrow slot with two wipers or squeegees, one on each longitudinal side of the slot. The slot and wipers ride over the stencil forcing the paste out of the slot into the apertures in the stencil. The angle of the slot in the head of the stencil is not adjustable and is set relative to the material handling system that serves stencil/substrate/dies assemblies to the head so that the longitudinal dimension of the slot is 2–3° from parallel to one of the two sets of orthogonal streets.

It is an object of the present invention to provide an improved stencil printing machine.

It is another object of the present invention to provide an improved method for encapsulating semiconductor dies or other devices using stencil printing.

It is a further object of the present invention to provide an improved stencil printing apparatus for encapsulating semiconductors.

It is yet a further object of the present invention to provide an improved apparatus for encapsulating semiconductors using stencil printing.

SUMMARY OF THE INVENTION

The present invention is a method and apparatus for encapsulating semiconductor dies and other devices using stencil printing techniques. The apparatus includes a pressurized vessel for containing encapsulation material, the apparatus having a stencil head that traverses the stencil, the head including a slot through which the encapsulating material escapes into the apertures of the stencil. The head is angularly adjustable relative to the stencil and thus relative to the streets between semiconductor dies positioned in the apertures of the stencil. Accordingly, the head can be adjusted to the optimal angle for filling both the vertical and horizontal streets between the dies and minimizing the creation of voids in the encapsulant.

The method of the present invention involves encapsulating semiconductor dies using a pressurized stencil printing machine having a slot through which the encapsulating material is forced into the apertures of a stencil and wherein the slot is at a large angle to both the vertical and horizontal streets. Preferably, the angle is greater than 5 degrees. More preferably, the angle is 45 degrees to both the horizontal and vertical streets. Alternately, the angle is 15 degrees to one of the sets of streets (which would, inherently be seventy-five degrees to the other set of streets).

DETAILED DESCRIPTION OF THE INVENTION

Figure 1:
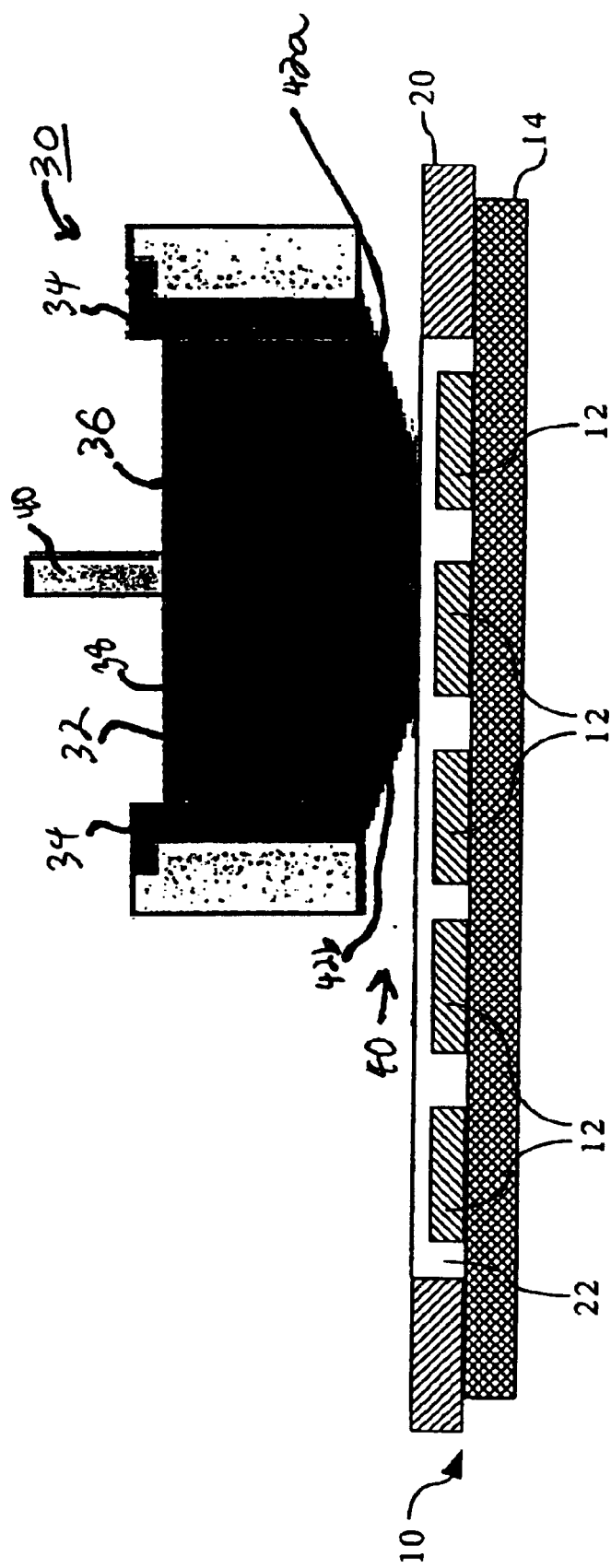
FIG. 1 is a cross sectional view of a simplified pressurized stencil printing machine in accordance with the present invention.

FIG. 1 is a cross-sectional, elevation view illustrating the basic components of a pressure type stencil printing machine being used to encapsulate semiconductor dies in accordance with the present invention. The figure is not necessarily visually representative of a particular machine, but simply illustrates the basic fundamental components. A substrate/stencil/dies assembly 10 is positioned under the head 40 of the stencil printing machine 30. The substrate/stencil/dies assembly 10 comprises a substrate 14 with a plurality of dies 12 placed thereon in a rectangular matrix and a stencil 20 placed therewover with the dies appearing through one of more apertures 22 in the stencil. The machine 30 includes a vessel 32 defined by walls 34 for containing an encapsulating material 36, which typically would be a liquid epoxy. A piston 38 and rod 40 is movably mounted at the top of the vessel 32. The piston 38 includes a rubber diaphragm that sealingly engages the wall 34 so that the encapsulating material 36 cannot escape around the edges of the piston. In operation, the rod 40 is forced downwardly to exert downward force on the encapsulating material 36, thus placing it under pressure.

Figure 2:
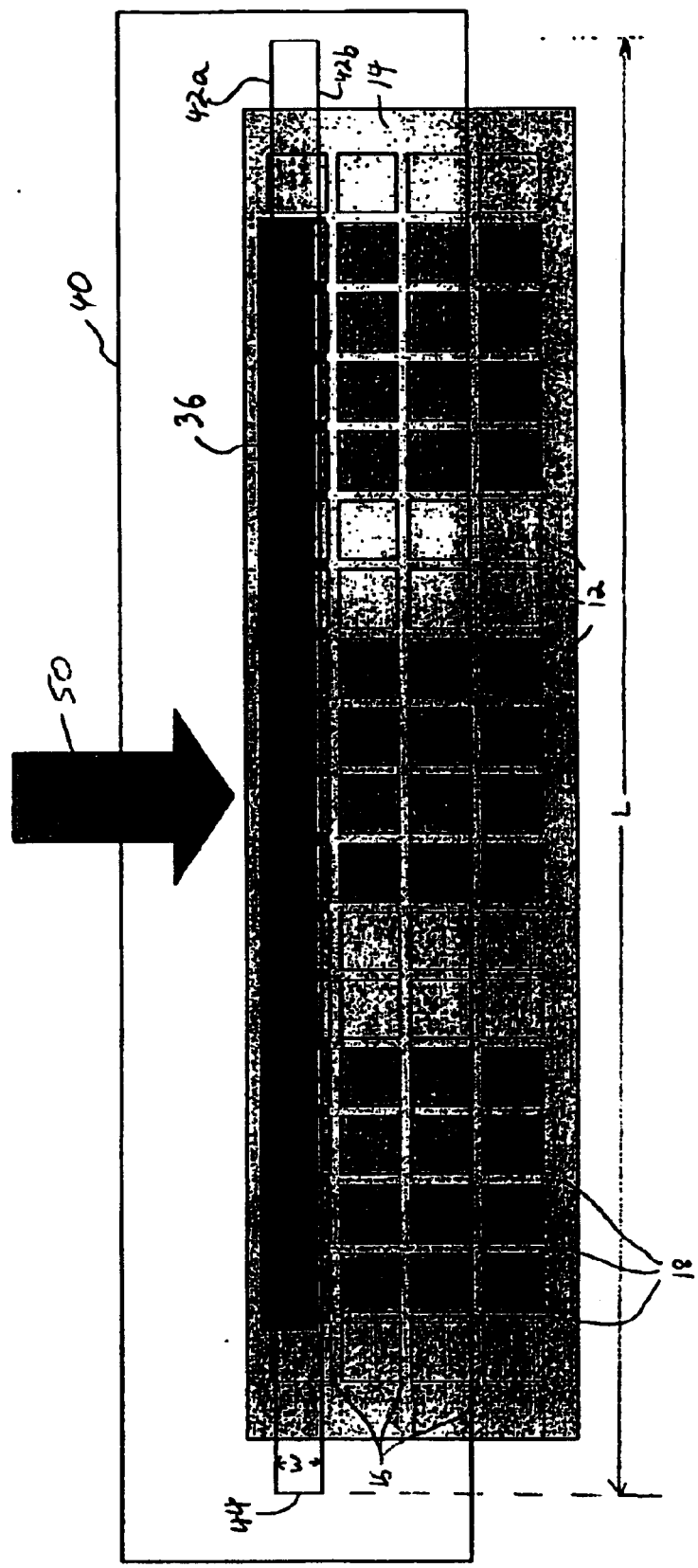
FIG. 2 is a pictorial representation of the head of a stencil printing machine passing over a stencil at a first angular orientation.

At the bottom of the vessel 32 is a stencil printing head 40 comprising two wipers or squeegees 42a and 42b and an opening 44 there between. The long dimension of the squeegees and opening is in the direction perpendicular to the page in FIG. 1. The material is under pressure under piston 38 and can escape from the vessel 32 only through the opening 44 into the apertures 22 in the stencil. With reference to FIG. 2, which is an overhead view illustrating the orientation of the head 40 to the underlying dies 12 and substrate 14, the opening 44 is a long, narrow slot.

Preferably, the length L of the slot is longer than the width of the stencil 20. The width W of the slot, on the other hand, should be less than the width of the dies 12. The opening should be long and narrow because the opening and squeegees must traverse the entire stencil in order to properly apply the epoxy into the apertures in the stencil to encapsulate the dies. Obviously, a long slot can traverse a wide swath of the stencil, and preferably its entire width, all at once, thus reducing the time required for the opening to traverse the entire stencil. On the other hand, the slot should be narrow in the direction perpendicular to its length so that the epoxy flows out of the opening 44 into the apertures in a controlled flow, rather than simply being dumped over a large area all at once. Preferably, the head traverses the stencil at least twice, once each in opposite directions, in order to assure good filling of the apertures with the encapsulating material.

After the stencil 20 is removed, the encapsulant is cured and the substrate/dies combination is diced along streets 16 and 18 to separate the finished encapsulated dies from each other.

As is well known to those working in the semiconductor packaging field, voids in the encapsulant tend to trap moisture that can attack the semiconductor circuitry. Voids also decrease mechanical strength, mar the surface which will be marked later, and allow entry of moisture into the package. Voids are considered a substantial defect. Accordingly, it is of great importance to eliminate or minimize voids in the encapsulant in order to increase yields.

I have found that, when attempting to encapsulate semiconductor dies using pressurized stencil printing techniques, the angle of the head 40 to the streets between the dies has a significant impact on the proper filling of those streets with encapsulant and particularly on the minimization of voids in the encapsulant. The angle of significance is the angle of the slot relative to the street in the plane of the top surface of the stencil. For instance, referring to FIG. 2, which is a plan view of a substrate/stencil/dies assembly 10 under the head 40 of the machine 30, the dies 12 are positioned on the substrate 14 in a rectangular matrix. The dies 12 are spaced from each other defining a plurality of parallel horizontal streets 16 and a plurality of parallel vertical streets 18 between the dies. The horizontal streets 16 are orthogonal to the vertical streets 18. A stencil 20 with an aperture 22 has been placed over the substrate 14 and dies 12 so that the dies appear through the aperture 22. The head 40 traverses the stencil in the direction of arrow 50. The slot 44 is at an angle of zero degrees with respect to the horizontal streets 16, i.e., the slot 44 is parallel to the horizontal streets 16. Inherently, therefore, the angle of the head 40 in FIG. 2 to the vertical streets is 90 degrees. It has been found that, with this particular orientation of the slot 44 to the streets 16 and 18, the vertical streets 18 fill very well, i.e., with virtually no voids, while the horizontal streets fill very poorly, i.e., with a large number of voids and/or voids of large dimensions. In more general terms, when the slot 40 traverses the stencil at a low angle relative to a street (i.e., parallel or close to parallel to the street), the encapsulant does not fill the street very well.

It is believed that there are two possible reasons for this phenomenon. First, when a very large feature is encountered by the slot and squeegee all at once, the force of the squeegee on the encapsulant tending to push the encapsulant into the feature is spread out over a large area and thus the force at any given point decreases significantly when the head encounters a street parallel to that street. Referring again to FIG. 2, the stencil printing head 40 is essentially parallel to the horizontal streets 16 and perpendicular to the vertical streets 18. The liquid encapsulant is shown at 36 as it flows into the stencil aperture 22 and, particularly, into the horizontal and vertical streets 16 and 18, respectively between the dies 12. As can be seen in FIG. 2, the slot 44 encounters the entire length of the horizontal streets 16 simultaneously, thus requiring a large amount of liquid encapsulant to flow through the slot all at once each time it encounters a horizontal street 16.

Further and perhaps more importantly, when a feature such as a long, thin street is encountered by the squeegee parallel to its length, there is insufficient time or area for the air in the street to be displaced out of the street before encapsulant completely overlies the street with the air trapped in the street.

Another significant problem with the slot 40 traversing the dies and stencil parallel to any streets is that the squeegees 42a and 42b, which press down on the stencil with force, can catch on the edges of the stencil apertures 22 or even on the edges of the dies 12 when parallel thereto.

Figure 3:
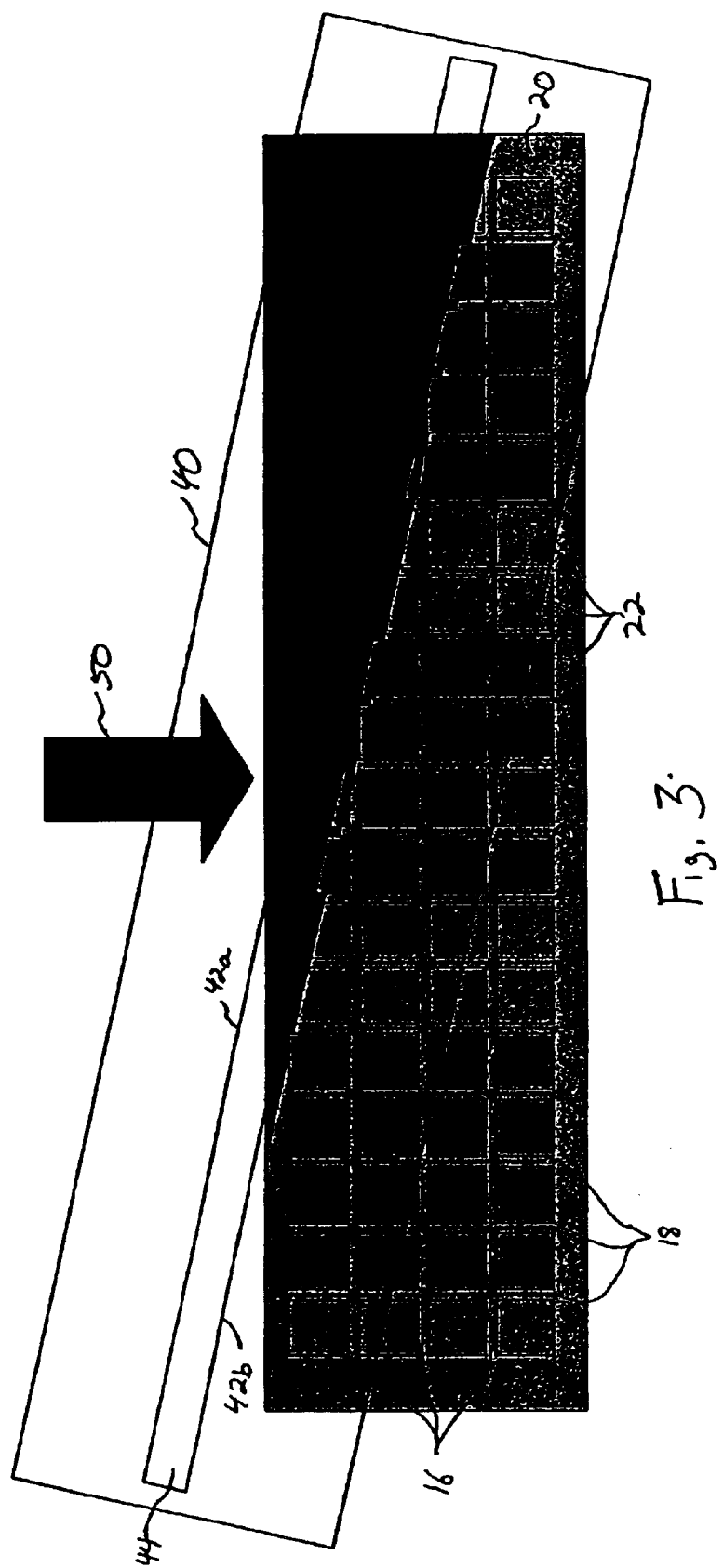
FIG. 3 is a pictorial representation of the head of the stencil printing machine passing over a stencil at a second angular orientation.

I have found that, by adjusting the angle of the head so that the slot does not encounter and fill the entire length of any street all at once, the number and size of voids can be reduced dramatically. Also, when the wiper and slot are at an angle to the edges of the dies, they are much less likely to catch on those edges since the point of contact between the edge and the squeegee at any given instance essentially is a point rather than a long line. FIG. 3 is a view similar to FIG. 2, but showing the cartridge head 40 at a larger angle to the horizontal streets 16 so that the entire length of the horizontal streets are not filled with the liquid encapsulant 36 all at once. Of course, any increase in the angle of the head 40 relative to the horizontal streets 16 inherently results in a decrease of the angle of the head relative to the vertical streets 18. However, generally, this is not a significant issue since it has been found that drastic reductions in voids are achieved at angles as low as 5 degrees. Accordingly, with the head at a five degree angle to the horizontal streets, it would still at an angle of 85 degrees relative to the vertical streets 18. Obviously, with the cartridge head oriented 45 degrees relative to the horizontal streets 16, it would inherently mean that the head was also oriented 45 degrees relative to the vertical street, thus providing uniformity of the head relative to all of the streets and thus, at least theoretically, providing uniform filling of the vertical and horizontal streets. In practice, this has been found to be quite accurate.

I have determined that an angle of fifteen degrees from the horizontal streets also provides particularly good results in terms of minimization of voids.

In a preferred embodiment of the invention, the head of the stencil printing apparatus is adjustable so that the angular orientation can be selectively adjusted based on the particular application. In one embodiment, the head may be fully adjustable 360 degrees. However, depending on the particular design of the machine, this may be difficult. Accordingly, in at least one preferred embodiment, the head is adjustable at least 45 degrees. Preferably, the range of that 45 degree adjustment covers from approximately 5 degrees to approximately 50 degrees relative to the horizontal streets between the dies.

The orientation of the head relative to the streets of the dies typically will be dictated by the material handling system. While, in theory, the invention can be practiced using a fixed head stencil printing machine and instead adjusting the orientation of the material handling system relative to the stencil printing machine, this would likely be extremely difficult in a practical sense. Particularly, most, if not all, material handling systems, stencil printing machines, and stencils are designed so that the substrate/stencil/dies assemblies 10 enter the stencil printing machine in an orientation in which one of the sets of orthogonal streets is parallel to the cartridge head.

While the invention has heretofore been described primarily in connection with encapsulation of semiconductor dies by stencil printing, it also can be applied to encapsulation of other devices by stencil printing, semiconductors dies merely being the most likely application.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

I claim:

1. An apparatus for encapsulating semiconductor dies by stencil printing comprising:
    a pressurized vessel for containing liquid encapsulating material therein; and
    a stencil printing head for riding over a stencil, said head comprising a slot in fluid communication with said vessel for allowing said encapsulating material to escape from said vessel under pressure;
    wherein said slot is angularly adjustable.

2. The apparatus of claim 1 wherein said stencil printing head is angularly adjustable over a 45 degree range.

3. The apparatus of claim 2 wherein said apparatus is adapted to hold a stencil and die assembly comprising a plurality of dies arranged in a pattern defining a first set of parallel streets and a second set of parallel streets, said first and second sets of parallel streets orthogonal to each other and wherein said 45 degree angular range spans from 5 degrees to 50 degrees from a direction parallel to one of said sets of parallel streets.

4. The apparatus of claim 3 wherein said angular orientation of said slot to said one of said sets of parallel streets is set to 15 degrees.

5. The apparatus of claim 3 wherein said angular orientation of said slot to said one of said sets of parallel streets is set to 45 degrees.

6. The apparatus of claim 3 wherein said slot has a length that spans a length of a stencil.

7. The apparatus of claim 6 wherein said slot has a width less than a width of said die.

8. The apparatus of claim 6 further comprising first and second squeegees positioned on opposite sides of said length of said slot.

9. A method of encapsulating devices, said method comprising the steps of:
    (1) providing an assembly comprising a stencil with at least one aperture surrounding at least one die, said aperture and die defining at least first and second streets, each street comprising space between said die and an edge of said aperture, said first and second streets substantially orthogonal to each other;
    (2) placing liquid encapsulating material under pressure;
    (3) providing a slot that provides fluid communication between said pressurized liquid encapsulating material and said assembly through which said liquid encapsulating material can be made to flow into said aperture and enclose said die;

(4) orienting said slot so that it is at an angle greater than 3 degrees relative to both said first and second streets; and (5) forcing said liquid encapsulating material into said aperture through said slot via said pressure as said slot traverses said stencil, whereby said liquid encapsulating material enters said streets.

10. The method of claim 9 wherein said devices are semiconductor dies.

11. The method of claim 10 wherein said angle is between 5 and 50 degrees relative to said first street.

12. The method of claim 11 wherein said angle is 15 degrees relative to said first street.

13. The method of claim 11 wherein said angle is 45 degrees relative to said first street.

14. The method of claim 11 wherein said die comprises a plurality of dies arranged in a pattern whereas said first street comprises a plurality of streets and said second street comprises a plurality of streets.

15. The method of claim 14 wherein said aperture comprises a plurality of said apertures, each surrounding a plurality of dies.

16. The method of claim 11 wherein step (3) further comprises providing first and second squeegees on opposite sides of said slot, respectively.

17. The method of claim 9 wherein step (5) comprises traversing all of said stencil with said slot at least once each in opposite directions.

18. The method of claim 9 further comprising the step of:

(6) curing said encapsulating material after step (5).

* * * * *